US005635841A

United States Patent [19]
Taylor

[11] Patent Number: 5,635,841
[45] Date of Patent: Jun. 3, 1997

[54] ELECTRONIC IGNITION CONTROL MODULE TEST SYSTEM

[75] Inventor: Bobby D. Taylor, Anaheim, Calif.

[73] Assignee: Innova Electronic Corporation, Fountain Valley, Calif.

[21] Appl. No.: 414,628

[22] Filed: Mar. 31, 1995

[51] Int. Cl.⁶ .................................................. F02P 17/00
[52] U.S. Cl. ................................. 324/380; 324/384
[58] Field of Search .............................. 324/402, 384, 324/383, 380

[56] References Cited

U.S. PATENT DOCUMENTS

| | | | |
|---|---|---|---|
| 4,112,748 | 9/1978 | Walley | 73/118 |
| 4,684,896 | 8/1987 | Weishaupt | 324/380 |
| 4,689,573 | 8/1987 | Hilmer | 324/380 |
| 5,491,418 | 2/1996 | Alfaro et al. | 324/402 |

*Primary Examiner*—Louis M. Arana
*Attorney, Agent, or Firm*—Stetina Brunda & Buyan

[57] ABSTRACT

A method for testing an electronic ignition control module utilizes the steps of: placing the electronic ignition control module in electrical communication with an electronic ignition control module tester; the tester identifying the electronic ignition control module in electrical communication therewith so as to determine the type thereof; the tester performing testing of the electronic ignition control module, the particular tests performed being dependent upon the particular electronic ignition control module type being tester; the tester indicating pass/fail condition of the electronic ignition control module. Having the tester identify the electronic ignition control module type and perform testing which depends upon the particular electronic ignition control module type being tested eliminates the need for a user to define the tests to be performed. An adaptor cable being dedicated for use with a particular electronic ignition control module type is preferably utilized to electrically interconnect the electronic ignition module tester and the electronic ignition control module. The adaptor cable preferably facilitates identification of the electronic ignition control module type.

9 Claims, 12 Drawing Sheets

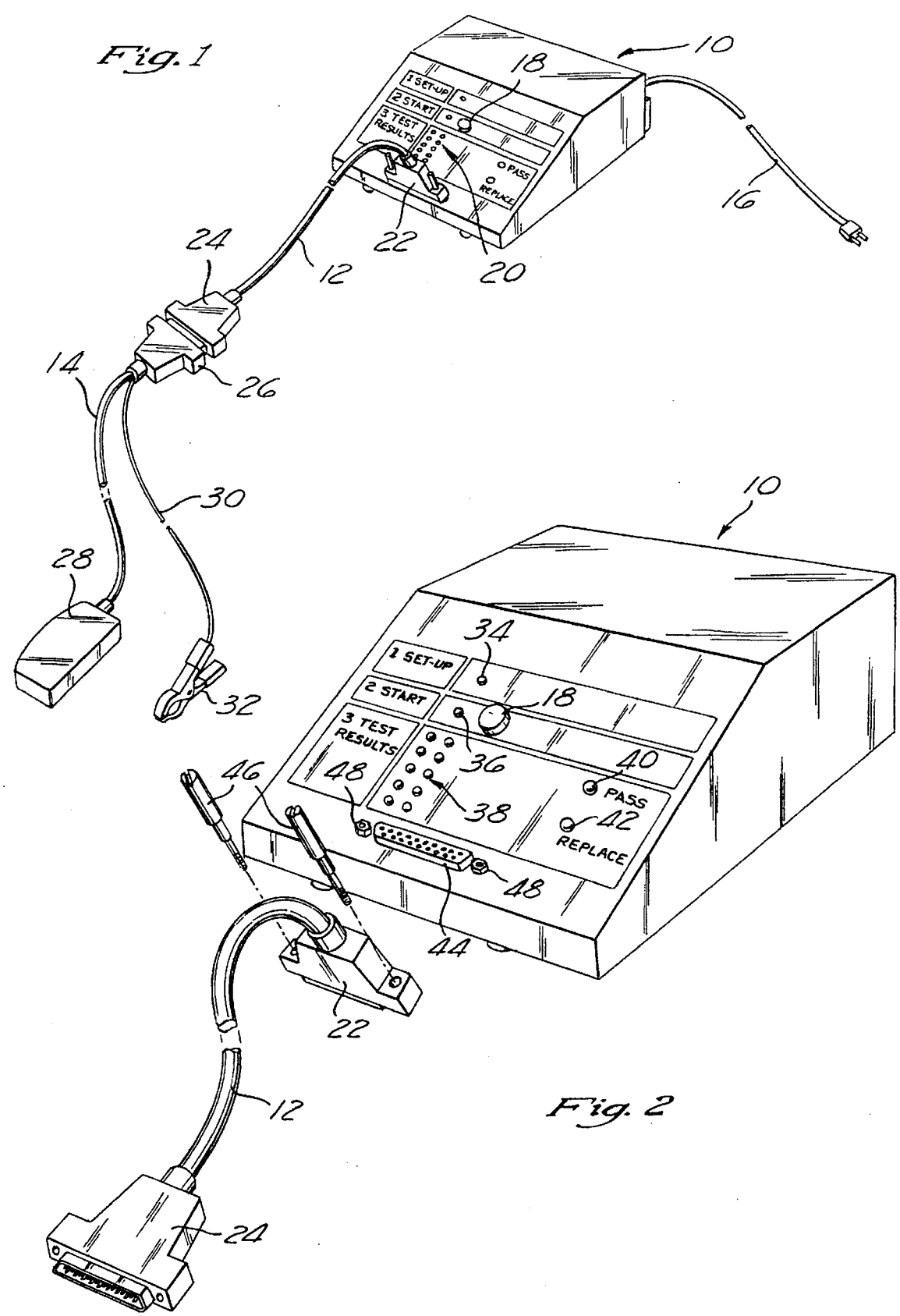

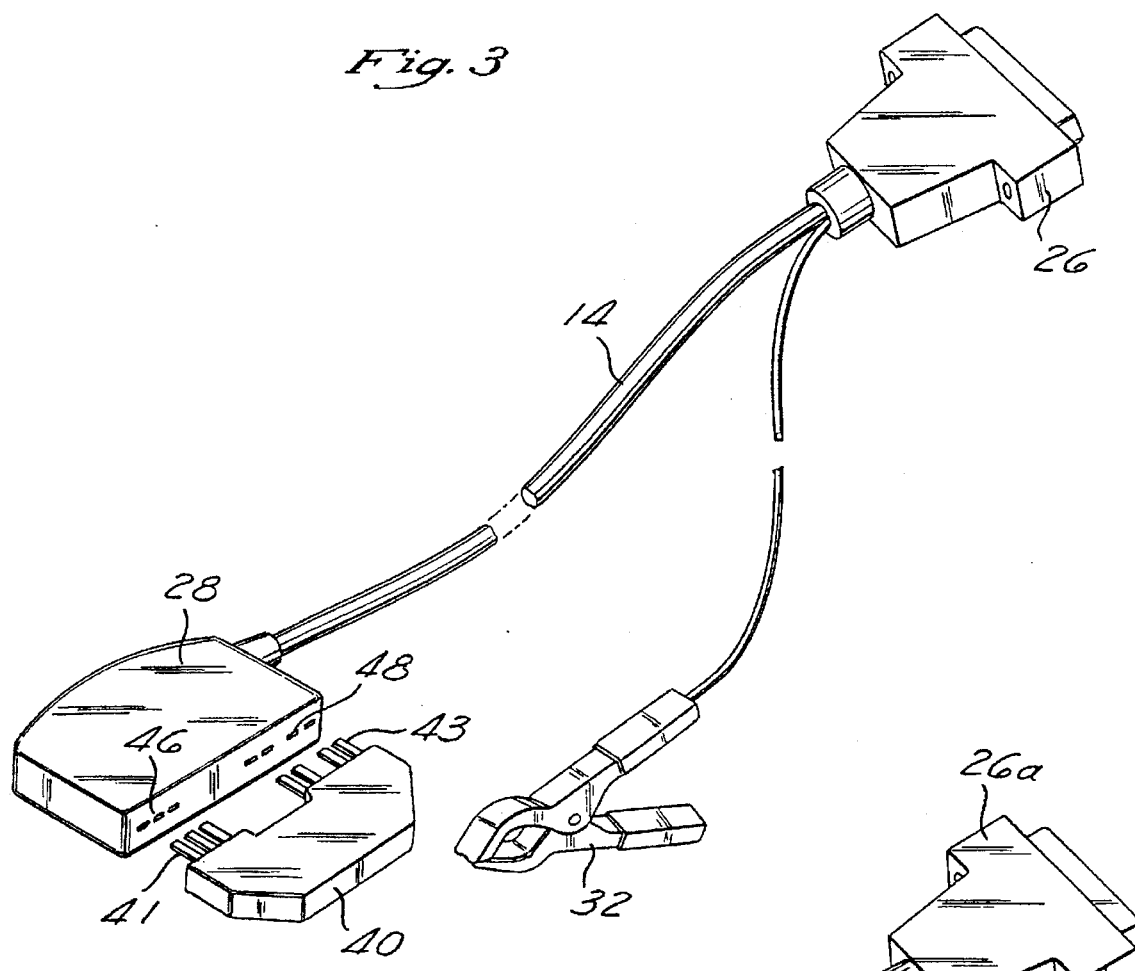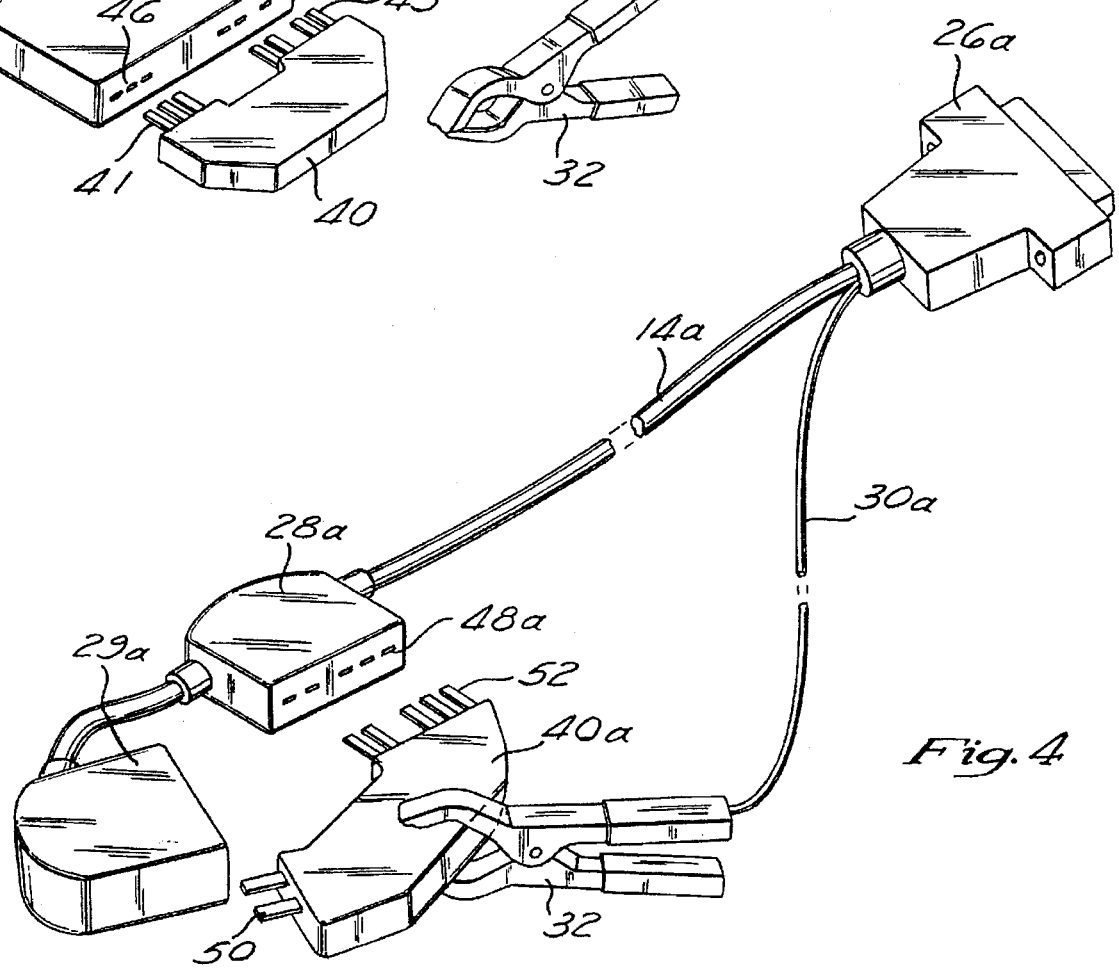

ELECTRONIC IGNITION CONTROL MODULE TEST SYSTEM

FIELD OF THE INVENTION

The present invention relates generally to electronic test equipment and more particularly to an electronic ignition control module test system for testing automotive electronic ignition control modules under load conditions which simulate actual usage thereof in an automobile.

BACKGROUND OF THE INVENTION

Electronic ignition control modules for providing input pulses to an automobile ignition coil's primary circuit are well-known. Such electronic ignition control modules have been in common use since 1974. They generally replace the cam and contact breaker points assembly utilized in earlier automobiles since this assembly is subject to wear and requires frequent maintenance.

A further disadvantage of utilizing conventional contact point type ignition systems is that the higher the RPM of the engine, the less time the points are closed. This decreases the secondary voltage of the ignition coil as well as the ignition on time and ignition primary current at higher RPM's. The end result is a decrease in the ignition spark quality within the combustion chamber which causes poor engine performance and an increase in exhaust emissions.

A yet further disadvantage of conventional contact points is that in such conventional ignition systems, the opening and closing of the contact points is relatively slow in comparison to the speed with which newer electronic ignition control module systems operate. Thus, engine performance is substantially better in automobiles utilizing the newer electronic ignition control module systems.

General Motors Corporation installed the first discrete electronic ignition system on vehicles in 1970. The remaining domestic car manufacturers installed electronic ignition systems in 1973 and 1974, either utilizing discrete electronics or micro processors. Vehicles imported into the U.S.A. presently utilize an electronic ignition system in order to meet E.P.A. requirements.

The signal that is generated by the pick-up coil to turn the control module on and off is either generated with an AC pick-up coil mounted in the distributor, at the crank shaft harmonic balancer or by using a Hall Effect sensor in the distributor to develop a square waveform. The AC generator pick-up coil produces a cosecant sine wave.

When the control module sees an AC ripple going from a positive to a negative or a negative to a positive voltage, it will trigger the ignition coil. A Hall Effect sensor, at either the crankshaft or within the distributor, will create the same positive or negative waveform causing the control module to turn on and off.

There are similarities among all control modules, particularly in their function or operation. In all control modules a signal from an outside source is required. The outside source is typically either an AC signal or Hall Effect transducer which is utilized to trigger the control module. Some control modules must have a north seeking magnetic field to properly trigger the control module. Others require a south seeking magnetic field. Within the control module is typically disposed a spark timing monitoring circuit, a lock prevention circuit, a duty control circuit, a current limiting circuit, a power switching circuit, an advance circuit, a retard circuit, and a dynamic knock circuit. Some control modules will have all of these circuits, while others may have just one or two of these circuits, depending upon the design characteristics of the particular control module.

A spark timing signal monitoring circuit monitors and amplifies the signal from the distributor pick-up coil. When this circuit is damaged, the resulting erratic timing causes poor fuel economy, higher exhaust emissions, etc.

A lock-preventing circuit cuts off the ignition coil primary circuit current when the ignition is on and the engine is not running. A problem with the lock-generating circuit could cause a no start condition.

A duty control circuit controls the ratio of ignition coil primary current on-off time, equivalent to dwell angle. This circuit is RPM sensitive and if it is damaged dwell control will be lost.

A power switching circuit creates or breaks primary circuit current flow of the ignition coil. A failure in this circuit can cause the ignition system to become inoperative.

A current limiting circuit prevents excessive current from entering the power switching circuit. A failure in this circuit can cause damage to either the power switching circuit or to the ignition coil's primary winding.

The PIP assembly generates a signal which indicates crank shaft position and RPM. The PIP signal is supplied to and processed by the electronic ignition control module.

The electronic control module outputs an EST/SPOUT signal that is transmitted back to the electronic ignition module to control ignition timing, i.e., to advance or retard timing.

There are various input transducers and engine sensors that monitor different engine calibrations. These sensors provide input signals into the computer electronic ignition control module such as throttle position, engine speed, coolant temperature, intake manifold vacuum, and throttle position status. These input signals are processed by the computer or microprocessor of the electronic ignition control module which then determines the precise instant at which the ignition pulse (spark) is to be provided.

The points, condenser, and cam lobe of earlier automobile engines are replaced by an AC magnetic induction pick-up coil or a Hall Effect square waveform generator which turns the electronic ignition control module on and off depending on the RPM of the engine. The faster the reluctor or armature spins inside the pick-up coil, the correspondingly faster the pulse rate to turn the electronic ignition control module on and off becomes. This AC pulse turning the electronic ignition control module on and off is what turns the primary circuit of the ignition coil on and off.

This AC pulse is not effected by current or by wear such as are conventional point contacts wherein the rubbing block that the points are mounted to invariably wears down, consequently changing the dwell and thereby changing the timing. Such conventional contact points are also limited as to the amount of current that they are capable of handling.

However, this is not the case with electronic ignition control module systems. The rotation of the armature within the pick-up coil generates an AC ripple every time it passes a pyramid on the pick-up coil. There are as many pyramids both on the pick-up coil and on the reluctor as there are cylinders. For example, a four cylinder engine has four pyramids, on both the coil and on the reluctor, one pair for each cylinder. The faster the armature revolves within the pick-up coil, the faster the primary winding of the coil through the electronic ignition control module is triggered.

Electronic ignition control modules are solid state and may be embodied as either discrete or thick film. Either embodiment will contain and utilize various transistors, resistors, thermistors, Darlington gate circuits, etc.

The conventional ignition system could not induce enough primary ignition current into the coil at elevated RPM, therefore if the primary current was not saturating the primary winding of the ignition coil, then there would not be sufficient current at the spark plug. There is not enough time to electrically saturate the primary winding of the coil. In electronic ignition control modules, this problem does not exist. Transistors can inherently trigger much faster than the mechanical points.

Electronic ignition systems are generally referred to as high energy ignition systems. The basic function of the electronic ignition circuit is to permit a very rapid build up of current in the primary winding of the ignition coil. The function of the pick-up coil is to very rapidly interrupt the flow of that current such that the resulting fly back action will then induce the required high secondary voltage needed for the spark energy within the secondary winding of ignition coil, regardless of the RPM or speed of the engine.

There are currently two basic types of electronic ignition control modules designs. In the first type, a fixed dwell design is preset within the control module and in the second type, the dwell depends upon engine RPM. The fixed dwell will generally be in the neighborhood of 2 to 4 amps irrespective of engine RPM.

The varied dwell is sensitive to engine RPM. At very low RPM the need for primary current is low. Therefore, there is low current into the primary of the coil. High RPM or high engine speeds will provide high dwell or high current flowing through the control module.

Proper testing of an electronic ignition control module involves relatively complex troubleshooting procedures which are performed upon the automobile with the electronic ignition control module in place. A less rigorous and consequently less determinative method of troubleshooting potential electronic ignition control module problems consist of replacement of the electronic ignition control module in order to eliminate the symptoms of the problem.

However, contemporary methods of troubleshooting, i.e., rigorous testing and removal/replacement, have inherent deficiencies. Rigorous testing of the electronic ignition control module requires skill, proper test equipment, and a substantial amount of time. Such rigorous testing requires that a technician be adequately trained in the art of electronic troubleshooting and that the technician use sophisticated test equipment. The procedures and test equipment required generally vary among automobile manufacturers, further complicating the matter.

Removal and replacement of an electronic ignition control module as a troubleshooting procedure is often inadequate in that elimination of the problem often cannot be verified immediately and the use of a known good substitute ignition control module is required. It is not always possible to immediately verify elimination of the symptoms of the problem due to the fact that such symptoms are frequently intermittent in nature and thus often occur only under very specific conditions. Indeed, the symptoms may occur at random or seemingly random instances. Thus, after removal and replacement of the suspect electronic ignition control module, the automobile may have to be operated for many hours to verify eradication of the problem.

As mentioned above, removal and replacement of a suspect electronic ignition control module requires that a substitute, known-good, electronic ignition control module be provided. Not only does this generally require that such an electronic ignition control module be purchased, but also that the purchased electronic ignition control module be utilized for a substantial period of time, thus prohibiting return of the electronic ignition control module in the event that the symptoms of the problem are not eliminated thereby. Generally, automotive supply sources are reluctant to accept returns on such electronic devices since they are unable to verify their working condition.

Even so, the popular solution in the prior art when a defective electronic ignition control module is suspected, is to purchase a new unit and to remove/replace the suspect unit. This is done without knowing the validity of the test procedure until such time as elimination of the problem symptoms is verified.

Electronic ignition control module testers are also known wherein an electronic ignition control module is connected thereto and various different aspects of the electronic ignition control module are tested thereby. However, such electronic ignition control module testers are generally utilized by electronic ignition control module manufacturers to test only those specific electronic ignition control modules manufactured thereby. Electronic ignition control module testers which are intended to test electronic ignition control modules from a variety of different manufacturers, i.e., of a variety of different types, utilize comparatively complex cabling so as to facilitate electrical connection to the electronic ignition control module.

Such general purpose electronic ignition control module testers further require that the user define the proper sequence of tests, appropriate for the particular electronic ignition control module type being tested, and as such are comparatively complex to use.

Although the prior art has recognized the need for electronic ignition control module troubleshooting procedures and test equipment, such procedures and test equipment have to date been inadequate in providing a satisfactory remedy. Contemporary electronic ignition control module testers are either specifically intended for use with a particular electronic ignition control module type or require complex connections to the electronic ignition control module to be tested and complex definition of the tests to be performed thereon. It is thus extremely difficult, if not impossible, for untrained personnel to perform such tests in an efficient and reliable manner. As such, it is desirable to provide a simpler, more reliable means for testing electronic ignition control modules in order to verify their operational capabilities.

SUMMARY OF THE INVENTION

The present invention specifically addresses and alleviates the above-mentioned deficiencies associated with the prior art. More particularly, the present invention comprises an electronic ignition control module test system, the system comprising a plurality of adaptor cables, each adaptor cable being specifically configured for testing a particular electronic ignition control module type and being connectable to the electronic ignition control module and also connectable to an electronic ignition control module tester. The tester comprises identification circuitry for identifying the particular adaptor cable connected thereto. Since each cable is uniquely associated with a particular electronic ignition control module type, identification of the cable inherently provides like identification of the electronic ignition control module type attached thereto. Thus, by identifying the cable, the electronic ignition control module tester inherently also identifies the electronic ignition control module type.

The tester defines the test to be performed upon the electronic ignition control module based upon which particular adaptor cable, and consequently which particular electronic ignition control module type, is electronically connected thereto. Thus, selection of the appropriate adaptor cable for the electronic ignition control module to be tested causes the electronic ignition control module tester to perform the appropriate tests for that particular electronic ignition control module type.

The electronic ignition control module tester preferably comprises a single switch for effecting commencement of the tests to be performed upon the electronic ignition control module and an indicator for providing a pass/fail indication of the test performed.

At least one indicator, preferably a plurality thereof, are optionally provided upon the tester to provide an indication of which particular test is currently being performed thereby. Pass/fail indications for each of the tests performed upon the electronic ignition control module may optionally similarly be provided.

Indicia indicative of the particular adaptor cable to be utilized for a particular electronic ignition control module are preferably provided to facilitate easy selection of the appropriate adaptor cable to be utilized. Such indicia preferably comprise a photograph, drawing, or other graphical representation of each electronic ignition control module type which can be tested by the electronic ignition control module test assembly of the present invention. The user merely visually compares the electronic ignition control module to be tested to those illustrated by such indicia and then selects the adaptor cable associated therewith. Preferably, a number indicating the appropriate adaptor cable is provided proximate each depiction of a different electronic ignition control module displayed via such indicia.

The indicia are preferably formed upon a counter mat or wall chart instruction sheet. Thus, by positioning the counter mat proximate the electronic ignition control module of the present invention, means for conveniently selecting the appropriate adaptor cable are provided.

As mentioned above, identification circuitry within the tester senses which cable is connected thereto, thereby providing an indication of the type of electronic ignition control module to be tested such that the appropriate tests required therefore can easily be defined. Preferably, the identification circuitry comprises circuitry for sensing selected connections, e.g., pins, of the adaptor cable for open and short conditions thereof. Thus, the type of electronic ignition control module connected to the cable is encoded into a plurality of the connector pins of the cable by shorting selected pins to ground, for example. Those skilled in the art will recognize the various other means for encoding the electronic ignition module type into the cable are likewise suitable. For example, resistance, or other electrical parameters may be measured, or alternatively, an integrated circuit may be incorporated within the adaptor cable, such integrated circuit either digitally or via analog means providing such identification. Indeed, the electronic ignition control module tester may alternatively identify the electronic ignition control module type directly, rather than utilizing an adaptor cable to do so.

The tester preferably comprises a micro controller and a memory. Test instructions for each type of electronic ignition control module which can be tested by the electronic ignition control module test system of the present invention are stored within the memory. The micro controller effects reading of a selected list of predefined test instructions stored in the memory. Selection of the stored list is dependent upon the identification of the adaptor cable. Thus, a list of test instructions appropriate for the particular electronic ignition module being tested is utilized. The micro controller also controls execution of the list of test instructions so as to effect performance of the required tests.

The electronic ignition control module tester defines the test to be performed by first identifying the adaptor cable via a micro controller which senses the identification of the adaptor cable, preferably by sensing open and short conditions of particular pins thereof. The micro controller then effects reading of a selected stored list of predefined test instructions. Selection of the stored list is thus dependent upon the identification of the adaptor cable.

Some electronic ignition control module types require that a ground connection be made to the body thereof so as to properly simulate use thereof under load conditions within an automobile. For those adaptor cables which connect to an electronic ignition control module requiring such a ground connection, a ground connector is provided. The ground connector is preferably formed as a part of the adaptor cable, preferably as an alligator clip or clamp, thus eliminating the requirement for any separate ground connection.

For those adaptor cables which connect to an electronic ignition control module requiring an inductive post, such an inductive post is formed upon the adaptor cable, preferably molded within the cable. The inductive post is thus configured so as to simulate the actual mounting and connection of the electronic ignition control module within an automobile. Thus, the requirement for a separate inductive post, one mounted upon the electronic ignition control module tester, for example, is eliminated.

Thus, all of the various electrical connections required for testing automotive electronic ignition control modules under load conditions in a manner which simulates actual use thereof in an automobile is provided.

A transformer coupling is provided within the electronic ignition control module tester for driving the electronic ignition control module during testing thereof.

The tester preferably comprises Reference and PIP test circuitry, EST/SPOUT test circuitry, ECM control signal circuitry, pick-up signal circuitry, low RPM test circuitry, and high RPM test circuitry. The tester preferably further comprises short circuit test circuitry.

Thus, the method for testing an electronic ignition control module according to the present invention, comprises the steps of selecting an adaptor cable, the particular adaptor cable selected being dependent upon the electronic ignition control module type being tested. Such selection is preferably accomplished by comparing the electronic ignition control module to be tested to a countermat having graphical representations of different electronic ignition control modules formed thereupon. The electronic ignition control module to be tested is compared to the various electronic ignition control modules formed upon the countermat until a match is found. A number, for example, associated with the matched electronic ignition control module formed upon the countermat provides an indication as to which adaptor cable is to be utilized. The appropriate adaptor cable, that adaptor cable bearing the number indicated upon the countermat, is then utilized to test that particular electronic ignition control module.

A first end of the adaptor cable is electronically connected to the electronic ignition control module tester. The electronic ignition control module tester defines the test to be performed based upon which particular adaptor cable is attached thereto. A second end of the selected adaptor cable is electronically connected to the electronic ignition control module being tested. An optional extension cable may be utilized, for convenience. The optional extension cable is electrically connected intermediate the adaptor cable and the electronic ignition control module tester so as to effectively increase the overall length of the adaptor cable, thereby making handling of the adaptor cable and electronic ignition control module substantially easier.

Activating the electronic ignition control module tester, preferably by actuating a single switch, preferably a push button, effects testing of the electronic ignition control module.

A pass/fail indicator is observed at the completion of testing to provide an indication of the test results. Thus, the test is commenced by merely pressing a single push button and the test results are provided by observing a simple indicator. Optionally, further indicators may provide an indication as to which particular test is being performed at a given time and the results, i.e. pass or fail, of the particular test. Preferably, failure of any individual test immediately halts further testing and results in a failure indication. Thus, only by successfully completing each of the individual tests is a pass indication provided.

During testing of the electronic ignition control module, a transformer coupling is utilized to drive the electronic ignition control module. Both sides of the pick-up signal circuitry on the electronic ignition control module are thus driven.

The tester performs a Reference/PIP test and an EST/SPOUT test ECM control signals and pick-up signals are simulated. Typically, both a low RPM and high RPM test is performed. The tests are performed under the control of a micro controller, preferably an 83C751 micro controller.

Thus, an electronic ignition control module is tested according to the methodology of the present invention by merely selecting the appropriate adaptor cable, attaching the adaptor cable to the electronic ignition control module to be tested and to the tester, and then pressing a single push button to commence testing. A pass or fail indication is provided at the completion of testing.

As will be appreciated by those skilled in the art, performance of the test has been simplified to a point where unskilled and untrained persons may easily and reliably test automotive electronic ignition control modules in an easy and convenient manner.

These, as well as other advantages of the present invention will be more apparent from the following description and drawings. It is understood that changes in the specific structure shown and described may be made within the scope of the claims without departing from the spirit of the invention.

BRIEF DESCRIPTION OF THE DRAWINGS

FIG. 1 is a perspective view of the electronic ignition control module test system of the present invention showing a first adaptor cable attached to an extension cable, which in turn is attached to the electronic ignition control module tester;

FIG. 2 is an enlarged perspective view of the extension cable and electronic ignition control module tester of FIG. 1 showing the extension cable disconnected therefrom;

FIG. 3 is an enlarged perspective view of the first adaptor cable of FIG. 1 and also showing a first electronic ignition control module positioned for electrical connection thereto;

FIG. 4 is an enlarged perspective view of an second adaptor cable having a second electronic ignition control module positioned for attachment thereto and having the ground clamp of the second adaptor cable attached to the second electronic ignition control module;

DETAILED DESCRIPTION OF THE PREFERRED EMBODIMENT

Figure 5:
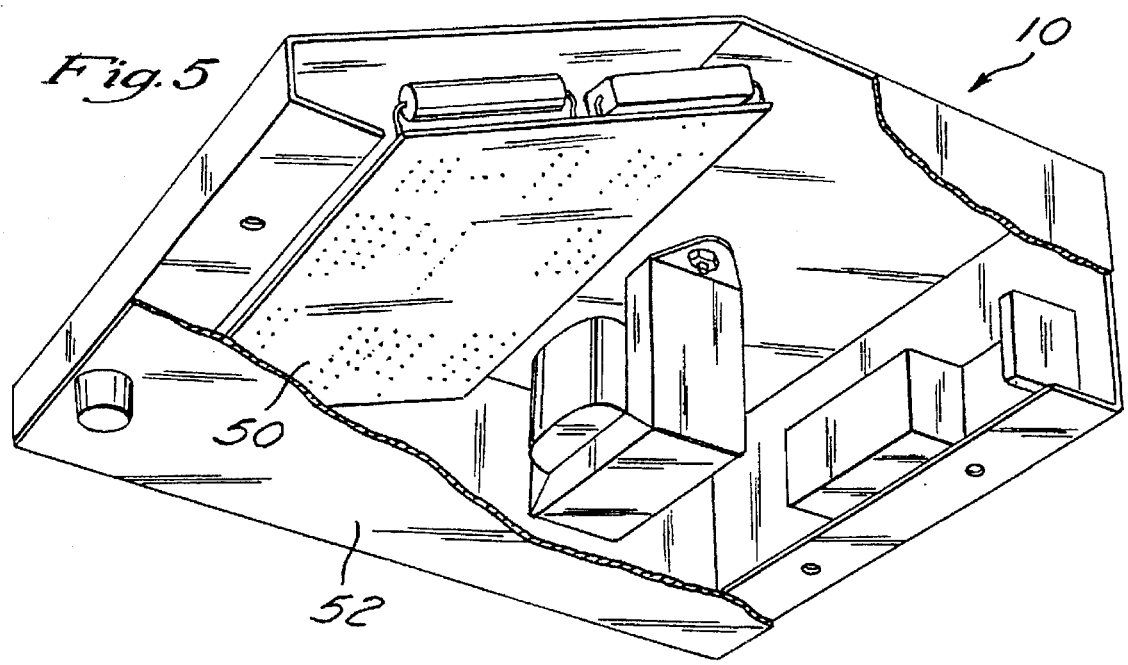
FIG. 5 is an enlarged perspective view of the underside of the electronic ignition control module of FIGS. 1 and 2 having a portion of the housing broken away therefrom so as to show the electrical components disposed within the interior thereof.

The detailed description set forth below in connection with the appended drawings is intended as a description of the presently preferred embodiment of the invention, and is not intended to represent the only form in which the present invention may be constructed or utilized. The description sets forth the functions and sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

The electronic ignition control module test system of the present invention is illustrated in FIGS. 1 through 16 which depict a presently preferred embodiment of the invention.

Referring now to FIG. 1, the electronic ignition control module test system of the present invention generally comprises an electronic ignition control module tester 10, an extension cable 12 electrically connected to the electronic ignition control module tester 10, and an adaptor cable 14 electrically connected to the extension cable 12.

The electronic ignition control module tester 10 further comprises a power cord 16 for providing power from a standard electrical wall outlet, and a single switch 18 for initiating the testing of an electronic ignition control module. A plurality of indicators are designated generally as 20 and discussed in further detail below. The adaptor cable 14 comprises an electrical connector 26 for providing electrical interconnection with the extension cable 12.

The extension cable 12 comprises a first connector 22 for providing electrical interconnection with the electronic ignition control module tester 10 and a second connector 24 for providing electrical interconnection with the adaptor cable 14.

Adaptor cable 14 further comprises electronic ignition control module connector 28 which is specifically physically configured for attachment to one particular type of electronic ignition control module. Thus, a plurality of adaptor cables 14 are provided wherein each individual adaptor cable 14 is specifically physically configured for attachment to a different electronic ignition control module type such that one adaptor cable 14 is provided for each electronic ignition control module type to be tested.

Means is provided for the identification of each adaptor cable 14 such that the electronic ignition control module tester 10 is capable of identifying the particular electronic ignition control module type being tested by identifying the adaptor cable 14 attached thereto.

A ground cable 30 and associated ground clamp 32 are provided with each adaptor cable 14 wherein an external ground is desired during testing of the particular electronic ignition control module associated therewith.

Referring now to FIG. 2, the electronic ignition control module tester 10 more particularly comprises a setup indicator 34 which indicates that the electronic ignition control module tester has been plugged into an active wall outlet and is turned on. An optional ON/OFF switch, located on the rear of the electronic ignition control module, facilitates control of the application of electrical power thereto. Preferably, set-up indicator 34 blinks to indicate that electrical power has been applied thereto and illuminates solidly when an electronic ignition control module has been connected to the adaptor cable 14.

A start indicator 36 indicates that the electronic ignition control module to be tested has been correctly connected to the adaptor cable 14 and that the adaptor cable 14 is correctly attached to the extension cable 12, which is in turn correctly attached to the electronic ignition control module tester 10. The start indicator 36 preferably blinks to indicate such correct connection prior to activating or depressing the momentary contact switch 18 for commencing testing and thereafter illuminates solidly to indicate that testing has commenced.

Test result indicators 38 provide an indication as to which test is being performed and whether that test was passed or failed. Preferably, a green indicator indicates that the test was passed and a corresponding red indicator indicates that the test was failed. Indicia associated with each pair of red and green indicators indicate which particular test results are indicated thereby.

A pass indicator 40, preferably green, illuminates to indicate that all tests required of the particular electronic ignition control module being tested have been successfully completed and a replace indicator 42, preferably red, illuminates to indicate that at least one of the tests has been failed and that the electronic ignition control module being tested is faulty and consequently requires replacement.

Connector 22 of the extension cable 12 attaches to complementary connector 44 of the electronic ignition control module tester 10 so as to facilitate electrical interconnection therebetween. Threaded male fasteners 46 threadably engage corresponding threaded female fasteners 48 to securely attach the connector 22 of the extension cable 12 to the electronic ignition control module tester 10 so as to prevent loosening thereof during the handling which occurs during testing.

Referring now to FIGS. 3 and 4, a plurality of different adaptor cables are provided so as to facilitate physical attachment and electrical interconnection of each type of electronic ignition control module to be tested to the electronic ignition control module tester 10. Two different adaptor cables, 14 and 14a, are shown in FIGS. 3 and 4, respectively. The number of adaptor cables associated with the electronic ignition control module tester of the present invention corresponds to the number of different electronic ignition control module types to be tested thereby. Each different electronic ignition control module type requires a different and dedicated adaptor cable, which connects to or shorts different combination of pin receptors within connector 44 (FIG. 2). Thus by determining which pin combinations are shorted or connected to a control module the identify of the connecting adaptor cable (and therefore the corresponding control module to be tested) can be determined appropriate testing routines can be implemented.

With particular reference to FIG. 3, connector 28 of adaptor cable 14 facilitates electrical interconnection of the electronic ignition control module tester 10 with an electronic control module 40 having three pins 42 on one side thereof and four pins 43 on the other side thereof. Thus, three individual connectors 46 are provided on one side of the connector 28 and four individual connections 48 are provided on the other side of the connector 28 so as to facilitate attachment of the electronic ignition control module 40 to the connector 28.

It is important to note that each different type of electronic ignition control module is physically configured so as to be different from each other type of electronic ignition control module such that each electronic ignition control module will only plug into a single connector 28 of the adaptor cable 14. Thus, by providing an adaptor cable which can be identified by the electronic ignition control module tester 10, the identify of the electronic ignition control module being tested is likewise determined by the electronic ignition control module tester 10.

With particular reference to FIG. 4, a different adaptor cable 14a is illustrated. Adaptor cable 14a has two separate connectors 28a and 29a which facilitate attachment to a different electronic control module 40a. The electronic control module 40a has two connectors 50 formed upon one end thereof and five connectors 52 formed upon the other end thereof which attach to connections such as 48a formed in the first 28a and second 29a connector. The ground clamp 32a is attached to the body of the electronic ignition control module 28a so as to facilitate grounding thereof.

Thus, in view of the physical configuration of connectors 28, 28a, and 29a, and the physical configuration of the electronic ignition control modules 40 and 40a of FIGS. 3 and 4, respectively, it will be appreciated that the user cannot inadvertently connect an electronic ignition control module to an adaptor cable which is not intended fur use therewith. For example, electronic ignition control module 40a of FIG. 4 cannot be inadvertently connected to adaptor cable 14 of FIG. 3.

Referring now to FIG. 5, a printed circuit board 50 disposed within the housing 52 of the electronic control module tester 10 has a microprocessor, preferably a 83C751-1N24 micro controller integrated circuit formed thereon. Additionally, various other electronic circuitry, as illustrated in FIGS. 9–16 is located upon the printed circuit board 50. Transformer 54, associated with the power supply of the electronic ignition control module 10 may either be located within the housing 52 thereof or external to the housing 52 thereof, preferably upon the power cord 61, as is common with contemporary electrical devices.

Additionally, those skilled in the art will recognize that the electronic ignition control module tester of the present invention may optionally be battery powered, thus eliminating the need for such a transformer 54 and power cord 16.

Figure 6:
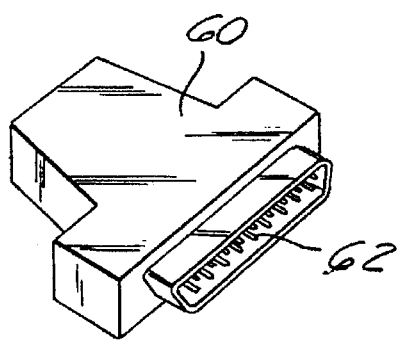
FIG. 6 is a perspective view of a self test connector for assuring reliable operation of the electronic ignition control module tester of the present invention.

Referring now to FIG. 6, a self test connector 60 is illustrated. The self test connector 60 comprises a plurality of individual connectors or pins 62 in electrical communication with circuitry disposed within the test connector 60 so as to simulate a known-good electronic ignition control module. Use of the test connector 60 thus facilitates testing of the electronic ignition control module tester 10 since all of the tests provided by the electronic ignition control module tester 10 may be performed upon the test connector 60. Any indication of a failure provided by the electronic ignition control module tester 10 thus actually indicates failure of the electronic ignition control module tester 10 itself.

Figure 7:
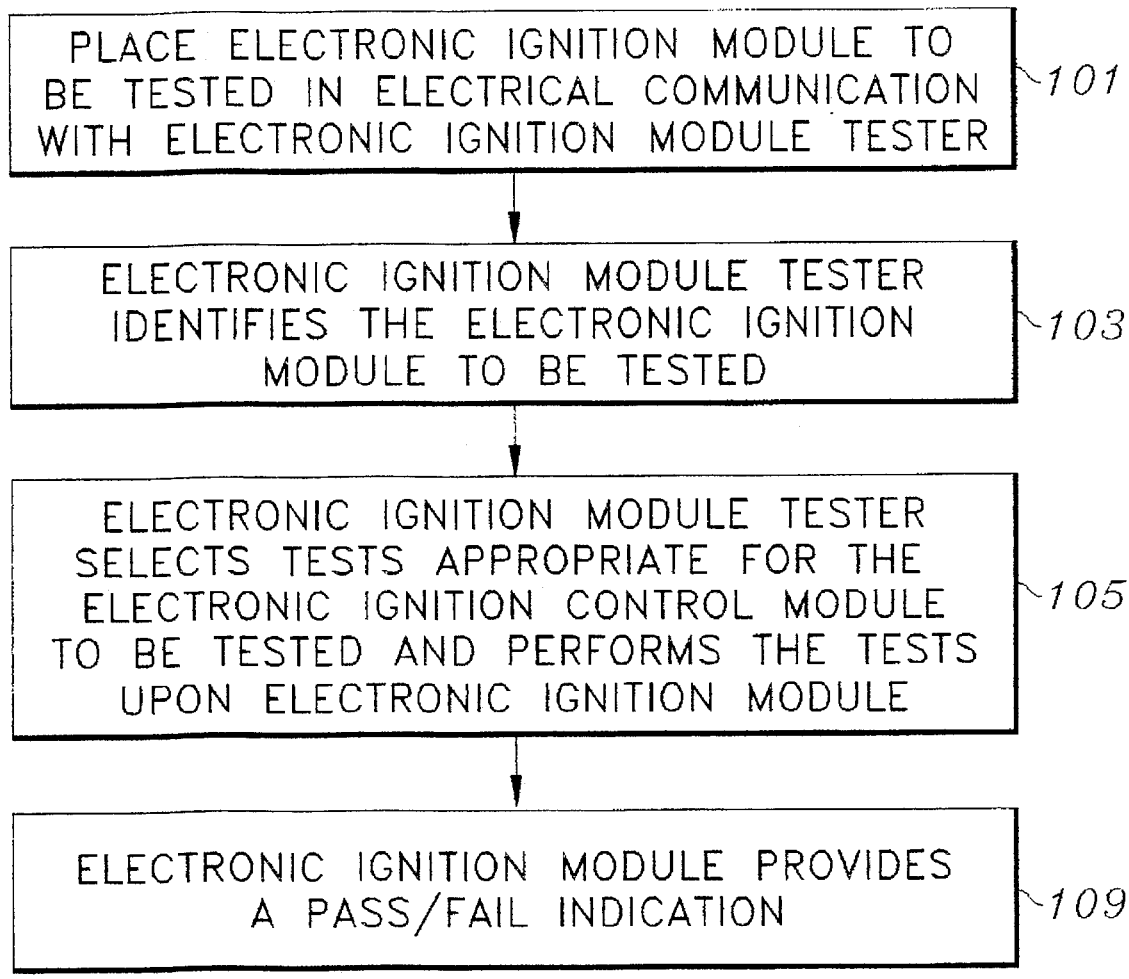
FIG. 7 is a flow chart of the method for testing an electronic ignition control module according to the present invention.

Referring now to FIG. 7, the method for testing an electronic ignition control module according to the present invention comprises the steps of (101) placing the electronic ignition control module to be tested in electrical communication with the electronic ignition control module tester; after which (103) the electronic ignition control module tester identifies the electronic ignition control module to be tested; and the (105) electronic ignition control module tester selects tests appropriate for the particular electronic ignition control module to be tested and then performs tests upon the electronic ignition control module. (107) The electronic ignition control module then provides a pass/fail indication of the condition of the electronic ignition control module. Programming used to identify the adaptor cable connected to the tester (and therefore identify the particular module to be tested) is set forth in attached as Appendix A.

A plurality of tests are typically performed upon the electronic ignition control module to be tested and a pass/fail indicator illuminated to indicate whether the electronic ignition control module being tested has passed all tests and is therefore suitable for use or has failed a test and must consequently be replaced. Thus, the failure of any test in the test sequence for the particular electronic ignition control module being tested results in illumination of the fail indicator. Preferably, the indicators are labeled upon the electronic ignition control module tester with the indicia "PASS" and "REPLACE", so as to eliminate any ambiguity as to whether or not the module being tested requires replacement thereof.

Figure 8:
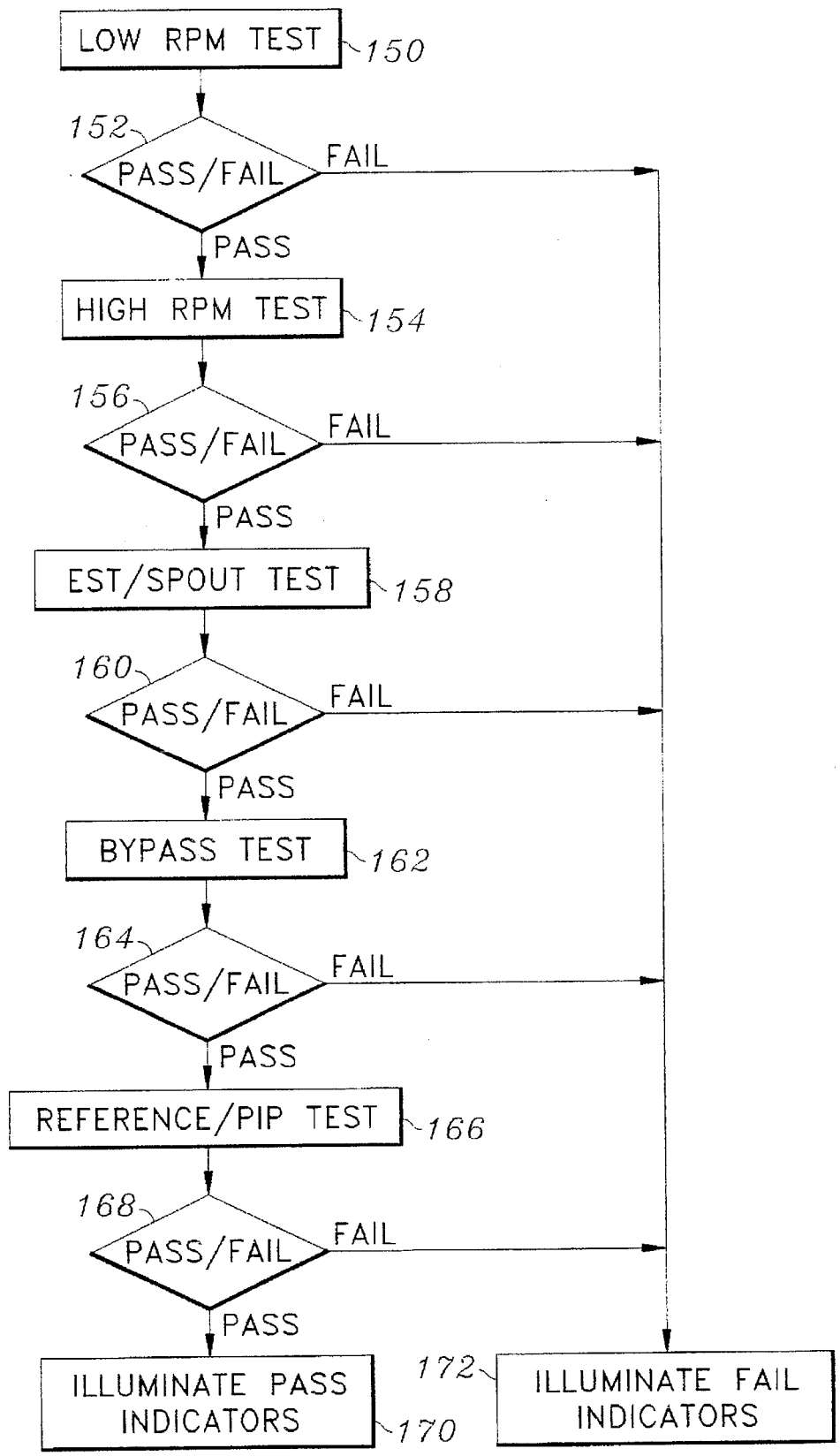
FIG. 8 is a flow chart of the tests to which a typical electronic ignition control module is subjected.

Referring now to FIG. 8, one example of a test sequence requires performance of a low RPM test 150 followed by a pass/fail decision 152 wherein a fail indicator is illuminated 170 if the low RPM test 150 was failed and the next test, a high RPM test 154 is performed if the low RPM test 150 was passed. In this manner, the high RPM test 154, Reference/PIP test 158, an EST/SPOUT test 162, and a bypass test 166, are performed. After each of these tests, a pass/fail decision 156, 160, 164, and 168 is made so as to determine whether or not to proceed to the next test in the sequence or to immediately illuminate the fail indicator 170. Upon successfully passing all of the tests, a pass indicator is illuminated 170.

Figure 9:
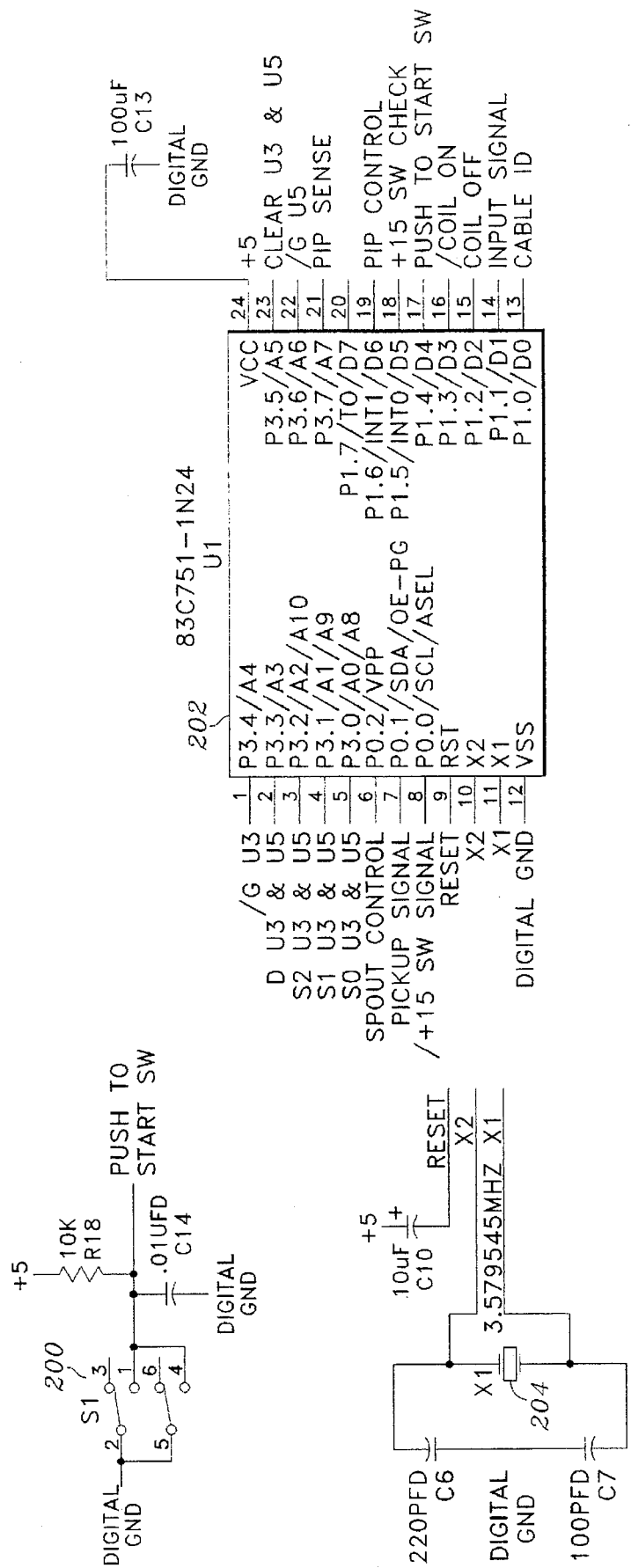
FIG. 9 is a partial schematic of the electronic ignition control module of the present invention showing the start switch, clock, and micro controller thereof.

Referring now to FIGS. 9–16, an electrical schematic of the electronic ignition control module is provided. With particular reference to FIG. 9, the start switch 200 preferably comprises a double pole double throw momentary contact push-button switch such as the Fujisoku, Part No. 8N2021.

The micro controller 202 preferably comprises a 83C751-1N24 micro controller integrated circuit. Those skilled in the art will recognize that various other micro controllers and/or general purpose micro processors are likewise suitable.

The clock circuit preferably comprises a 3.579545 MHZ crystal clock 204.

Figure 10:
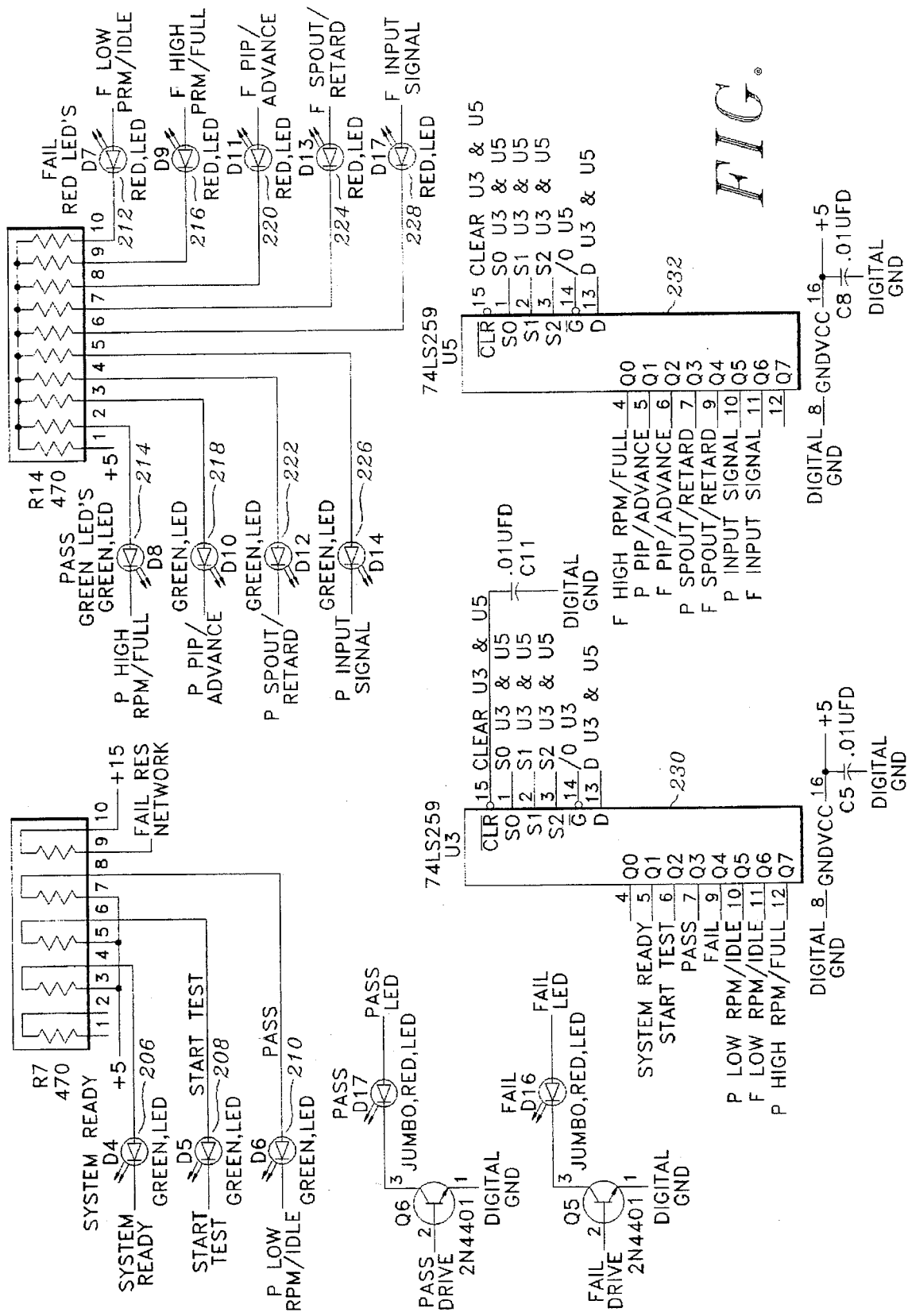
FIG. 10 is a partial schematic of the electronic ignition control module of the present invention showing the LED indicators and logic circuitry thereof.

With particular reference to FIG. 10, a system ready light 206 illuminates to indicate that power has been applied to the electronic ignition control module tester and that the tester is ready for operation. A start test indicator 208 indicates that an electronic ignition control module and its corresponding adaptor cable have been correctly connected to the electronic ignition control module test system and that the system is thus in a condition to facilitate testing of the electronic ignition control module. At this point, the user need merely depress the momentary contact push-button switch 200 (FIG. 9) to initiate testing of the electronic ignition control module.

After the momentary contact push-button switch 200 has been depressed, a plurality of test status indicators 210–228 indicate whether or not the electronic ignition control module being tested has passed each test. Green LED 210 indicates that the low RPM test has been passed and red LED 212 indicates that the low RPM test has failed. Green LED 214 indicates that the high RPM test has been passed and red LED 216 indicates that the high RPM has failed. Green LED 218 indicates that the PIP test has been passed and red indicator 220 indicates that the PIP test has been failed. Green LED 222 indicates that the SPOUT test has been passed and red LED 224 indicates that the SPOUT test has been failed. Green LED 226 indicates that the input signal test has been passed and red LED 228 indicates that the input signal test has been failed.

If all of the tests are successfully passed, then green LED 229 indicates that the electronic ignition control module has passed all tests and is good. If any test is failed, then red LED 231 indicates that the electronic ignition control module has failed a test and requires replacement.

Logic chips 230 and 232 provide the logic circuitry necessary for the micro controller 202 to indicate the status of the electronic ignition control module and the various tests performed thereby, as discussed above.

Figure 11:
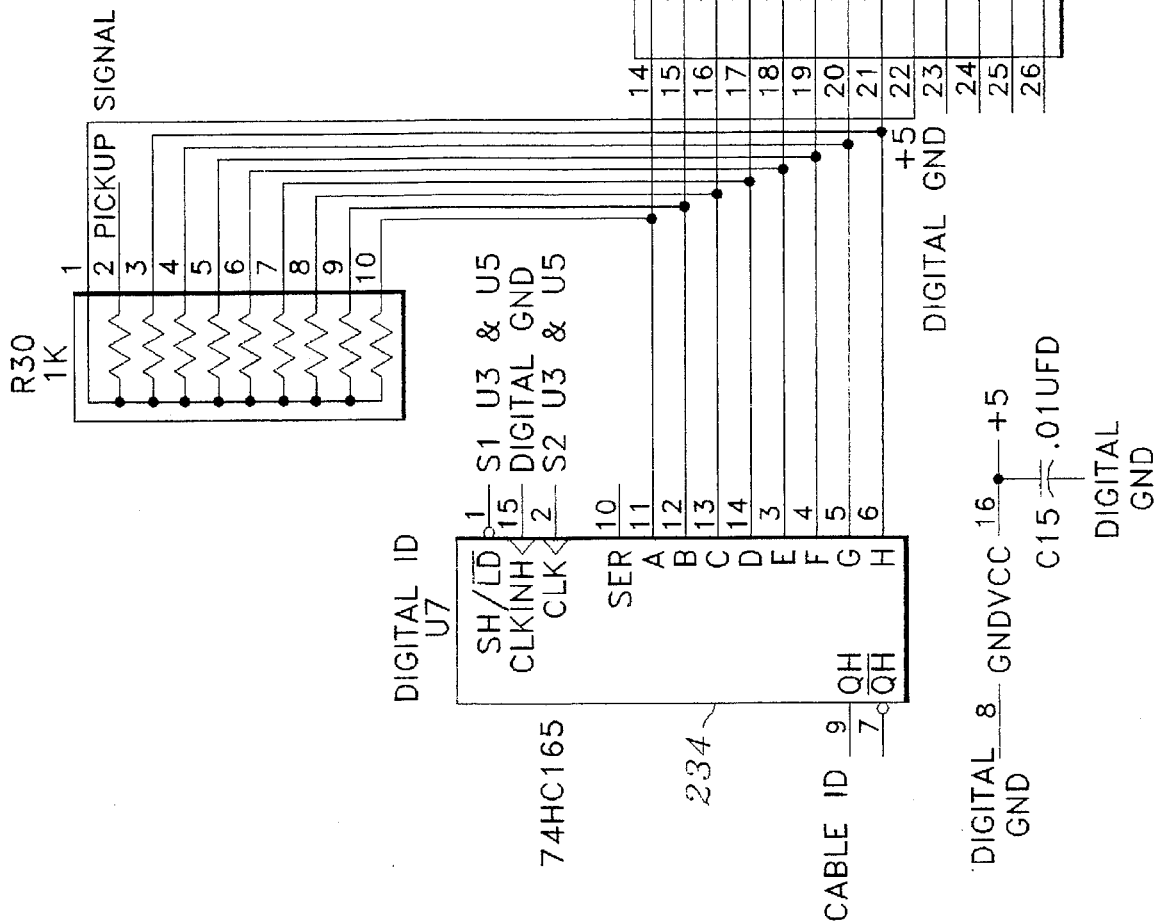
FIG. 11 is a partial schematic of the electronic ignition control module of the present invention showing the digital identification circuitry thereof.

With particular reference to FIG. 11, a 74HC165 integrated circuit facilitates decoding of the cable identification by detecting an open or closed condition of the eight cable identification pins of the adaptor cable. Thus, integrated circuit chip 234 senses whether each of the cable identification pins of the adaptor cable connector are connected to ground or not, thereby uniquely identifying the cable and corresponding electronic ignition control module.

Figure 12:
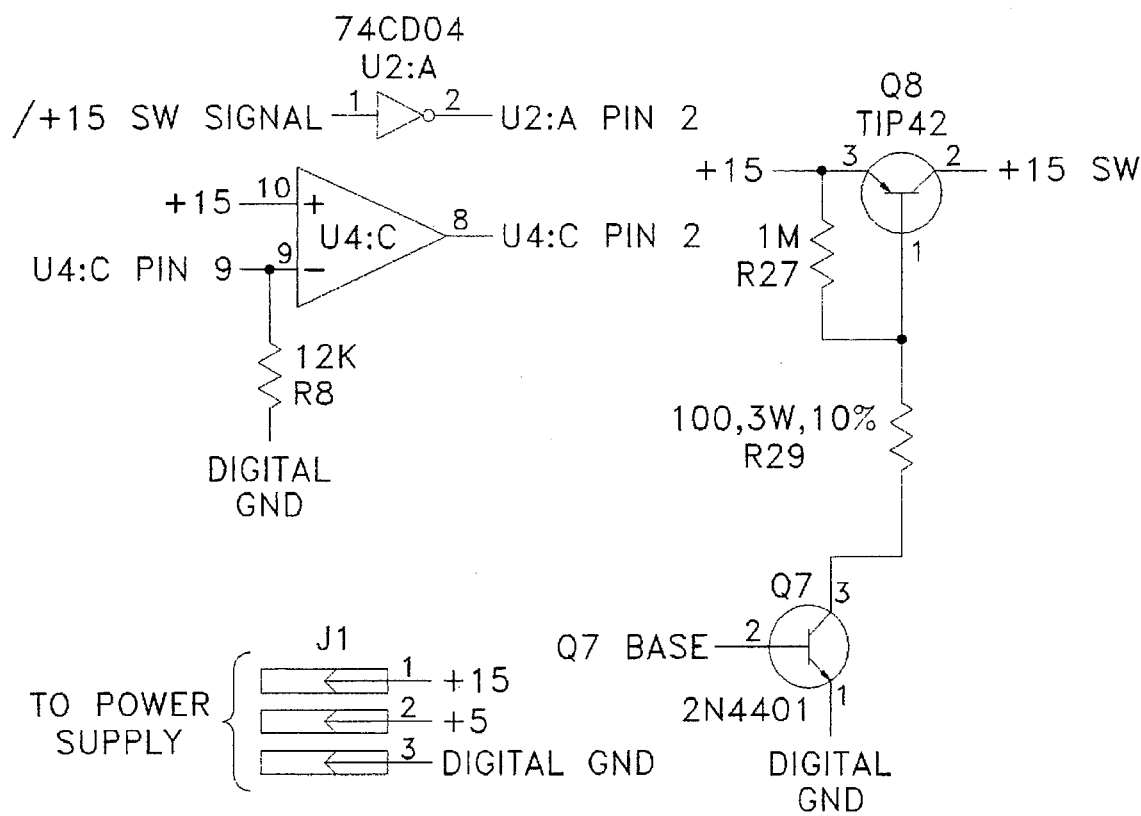
FIG. 12 is a partial schematic of the electronic ignition control module of the present invention showing the power supply control thereof.

With particular reference to FIG. 12, the power supply control circuitry depicted therein controls the output of a computer grade power supply so as to provide +5 VDC, +15 VDC, and digital ground.

Figure 13:
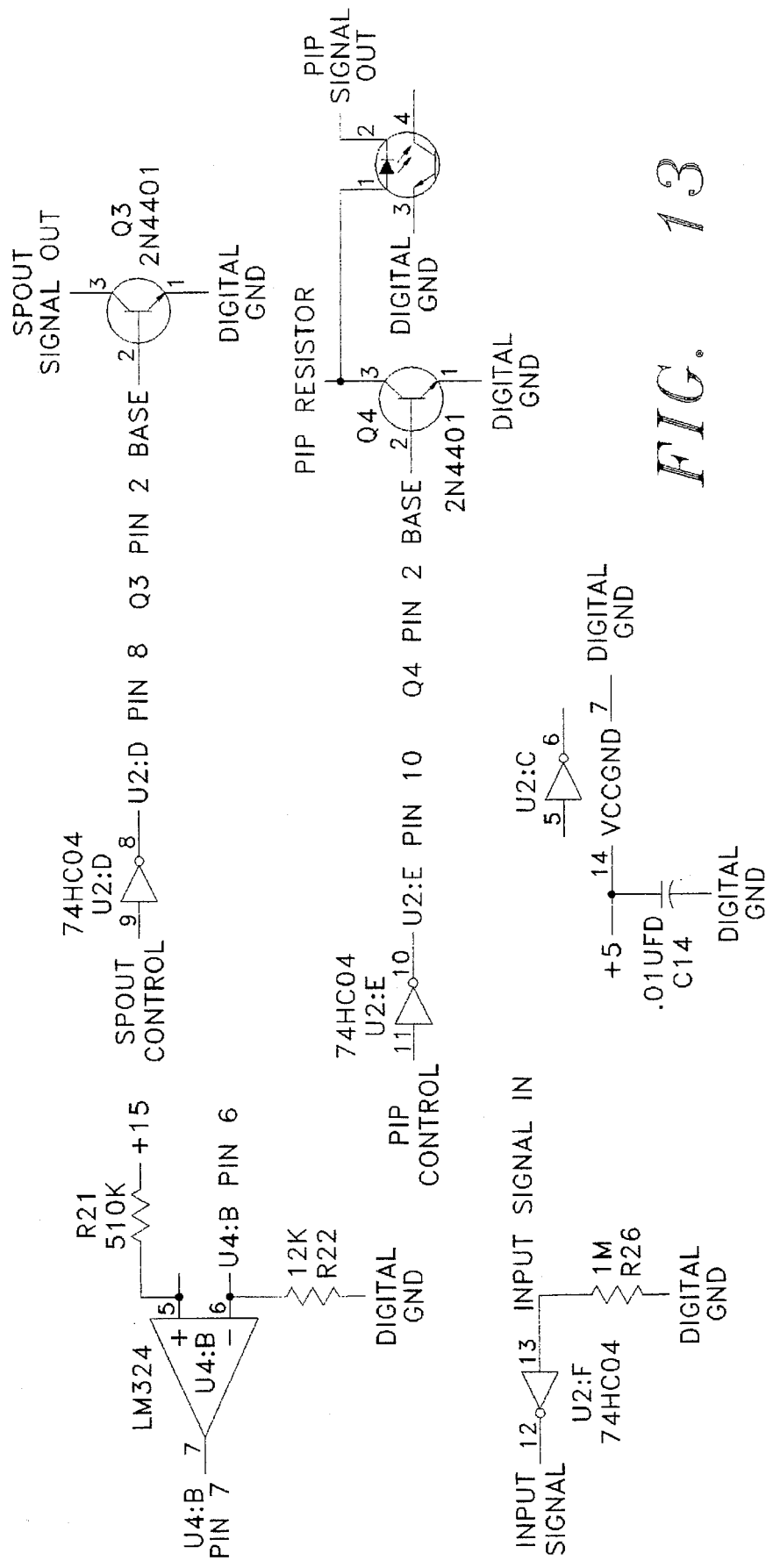
FIG. 13 is a partial schematic of the electronic ignition control module of the present invention showing ECM control signal circuitry thereof.

With particular reference to FIG. 13, various ECM signals are generated by the electronic ignition control module tester 10 to facilitate testing of the electronic ignition control module. These control signals preferably include bypass, a reference signal, PIP and SPOUT.

Figure 14:
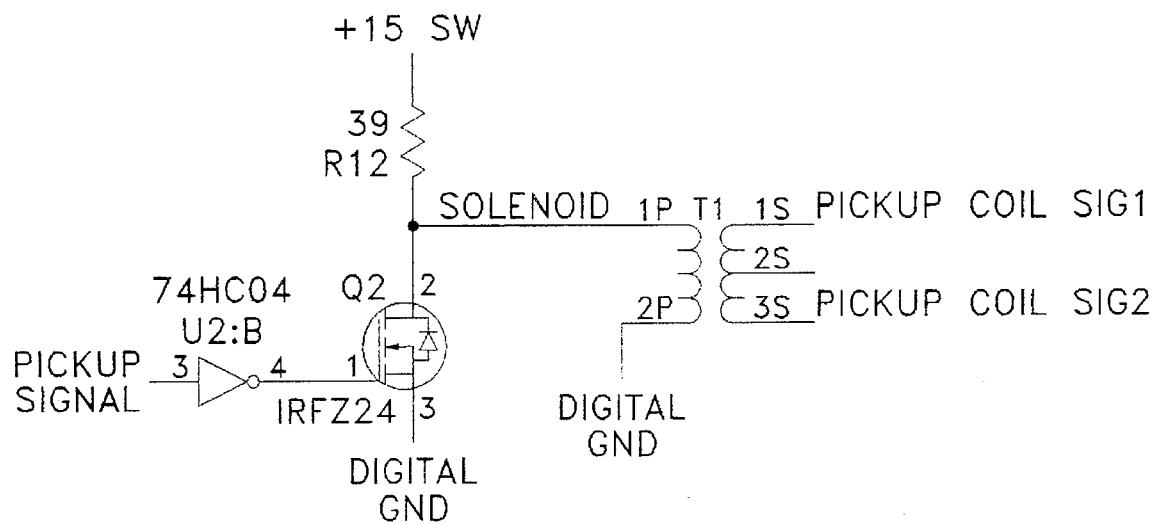
FIG. 14 is a partial schematic of the electronic ignition control module of the present invention showing the pick-up signal circuit thereof.

With particular reference to FIG. 14, a pickup signal circuit generates a pick-up signal to simulate the pick-up signal supplied by a reluctor when the electronic ignition control module is utilized in an automobile.

Figure 15:
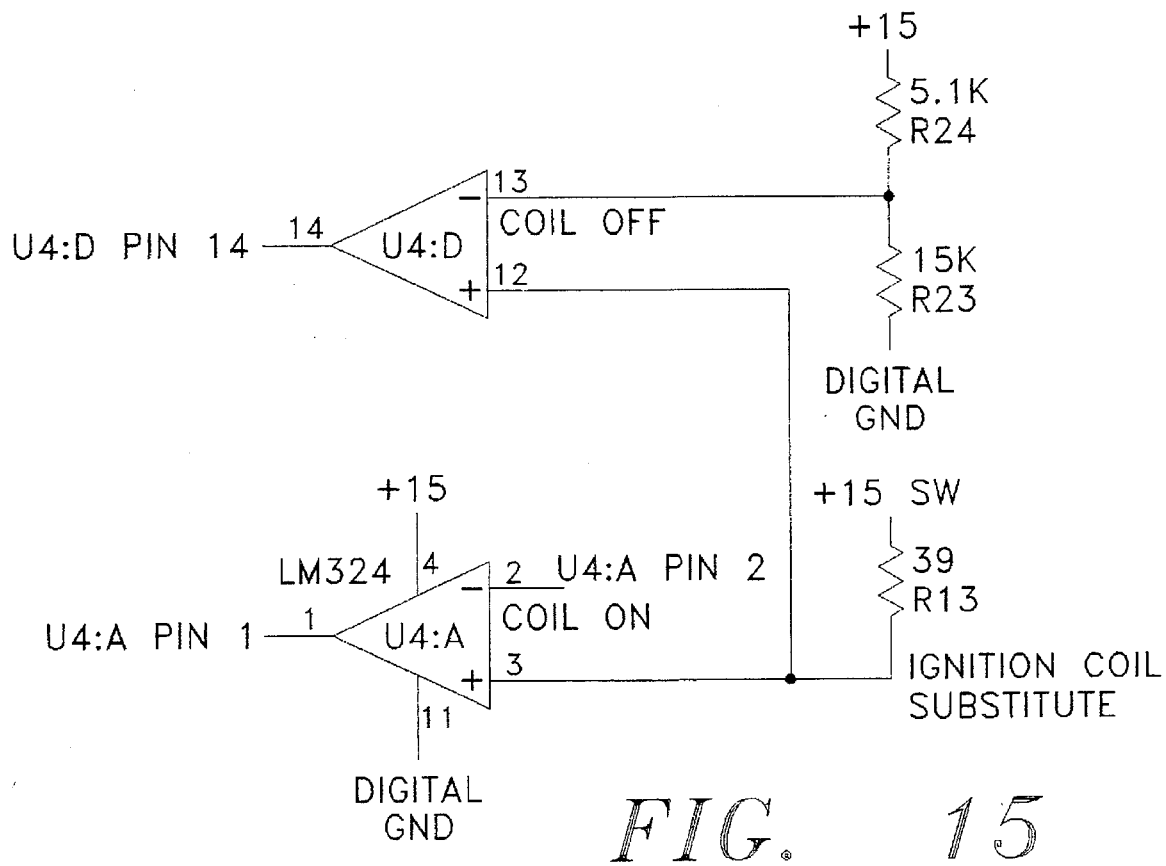
FIG. 15 is a partial schematic of the electronic ignition control module of the present invention showing the ignition coil substitute load circuit thereof.

With particular reference to FIG. 15, the ignition quill substitute circuit provides a substitute load for the electronic ignition control module to simulate the primary coil of an automobile ignition quill.

Figure 16:
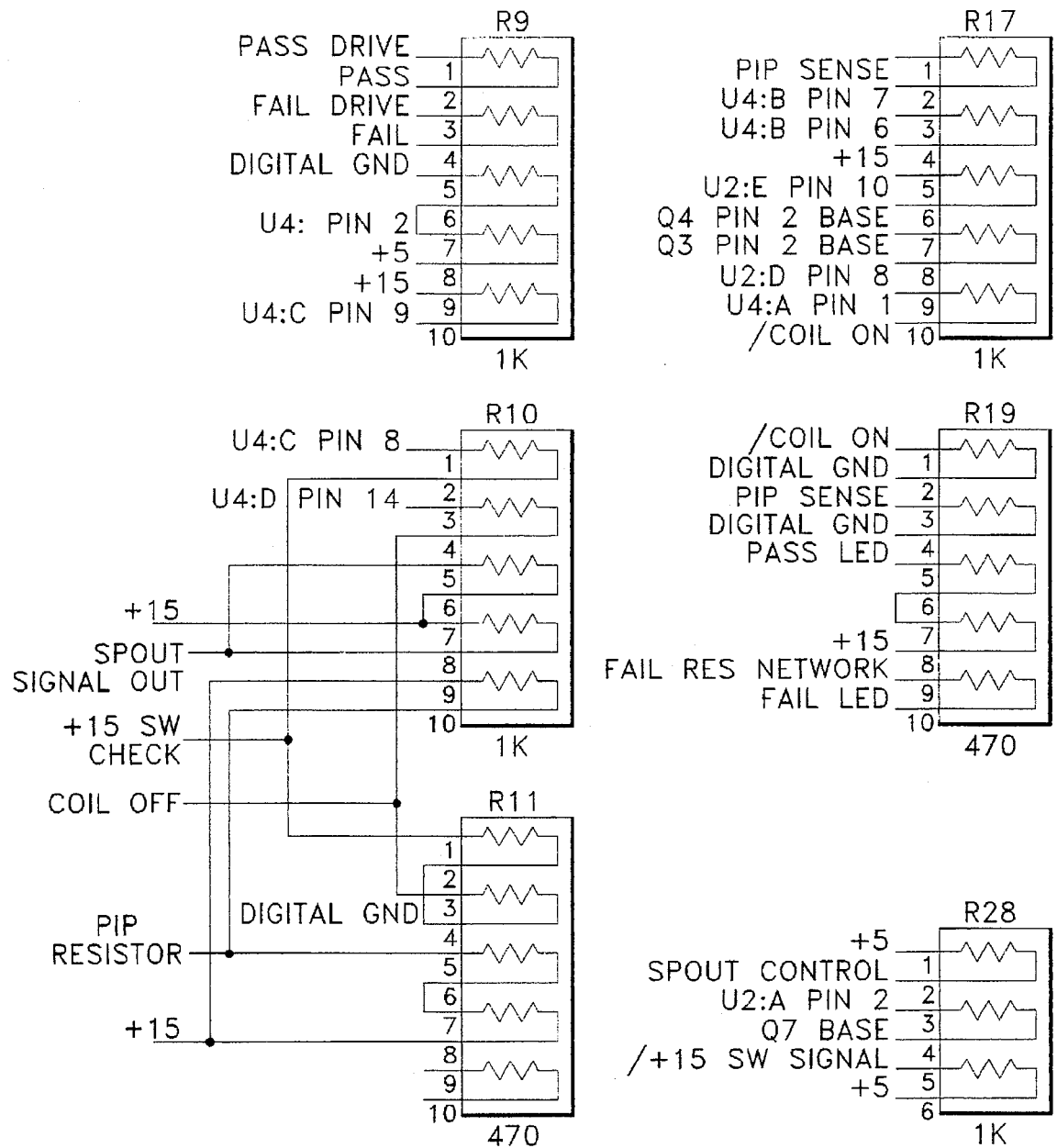
FIG. 16 is a partial schematic of the electronic ignition control module of the present invention showing the SIP resistor networks thereof.

With particular reference to FIG. 16, the SIP networks are single in-line packaged resistors utilized by the various circuitry of the electronic ignition control module tester 10.

It is understood that the exemplary electronic ignition control module test system described herein and shown in the drawings represents only a presently preferred embodiment of the invention. Indeed, various modifications and additions may be made to such embodiment without departing from the spirit and scope of the invention. For example, the cables which are utilized to identify the particular module type being tested may be replaced with various other connection means which likewise facilitate attachment to only a particular module type and which are identifiable by the electronic module tester. Indeed, the electronic ignition control module type may be identified by the electronic module tester by various other means. For example, the electronic ignition module tester could alternatively provide an output which causes the electronic ignition control module to respond in a manner which facilitates identification thereof, without the use of identifying cable connections. Thus, these and other modifications and additions may be obvious to those skilled in the art and may be implemented to adapt the present invention for use in a variety of different applications.

APPENDIX A

```
ID_1        equ 1          ;CableID_1
ID_2        equ 2          ;CableID_2
ID_3        equ 3          ;CableID_3
ID_4        equ 4          ;CableID_4
ID_5        equ 5          ;CableID_5
ID_6        equ 6          ;CableID_6
ID_7        equ 7          ;CableID_7
ID_8        equ 8          ;CableID_8
ID_9        equ 9          ;CableID_9
cable_err   equ 0f7h       ;Cable error
;**************************************************************
; Function: Subroutine to Read Cable ID
;           Called by Main Route
;**************************************************************
;
read_cable:
        setb    led_adr1            ;load cabel id data
        clr     led_adr1
        setb    led_adr1
        mov     count_cable,#2
msb_3:
        clr     led_adr2            ;shift data into microcontroller
        setb    led_adr2
        djnz    count_cable,msb_3
        mov     count_cable,#5
        mov     a,#0
shift_data:
        clr     led_adr2
        setb    led_adr2
        rl      a
        jnb     cable_data,skip
        inc     a
skip:
        djnz    count_cable,shift_data
```

APPENDIX A-continued

```
cable_1:
        cjne    a,#0h,cable_2
        ajmp    read_5              ;cable is ID_6
cable_2:
        cjne    a,#01h,cable_3
        ajmp    read_0              ;cable is ID_1
cable_3:
        cjne    a,#02h,cable_4
        ajmp    read_3              ;cable is ID_4
cable_4:
        cjne    a,#03h,cable_5
        ajmp    read_7              ;cable is ID_8
cable_5:
        cjne    a,#04h,cable_6
        ajmp    read_7              ;cable is ID_8
cable_6:
        cjne    a,#05h,cable_7
        ajmp    read_0              ;cable is ID_1
cable_7:
        cjne    a,#06h,cable_8
        ajmp    read_7              ;cable is ID_8
cable_8:
        cjne    a,#07h,cable_9
        ajmp    read_0              ;cable is ID_1
cable_9:
        cjne    a,#08h,cable_10
        ajmp    read_6              ;cable is ID_7
cable_10:
        cjne    a,#09h,cable_11
        ajmp    read_0              ;cable is ID_1
cable_11:
        cjne    a,#0ah,cable_12
        ajmp    read_0              ;cable is ID_1
cable_12:
        cjne    a,#0bh,cable_13
        ajmp    read_0              ;cable is ID_1
cable_13:
        cjne    a,#0ch,cable_14
        ajmp    read_0              ;cable is ID_1
cable_14:
        cjne    a,#0dh,cable_15
        ajmp    read_0              ;cable is ID_1
cable_15:
        cjne    a,#0eh,cable_16
        ajmp    read_0              ;cable is ID_1
cable_16:
        cjne    a,#0fh,cable_17
        ajmp    read_0              ;cable is ID_1
cable_17:
        cjne    a,#10h,cable_18
        ajmp    read_0              ;cable is ID_1
cable_18:
        cjne    a,#11h,cable_19
        ajmp    read_0              ;cable is ID_1
cable_19:
        cjne    a,#12h,cable_20
        ajmp    read_0              ;cable is ID_1
cable_20:
        cjne    a,#13h,cable_21
        ajmp    read_0              ;cable is ID_1
cable_21:
        cjne    a,#14h,cable_22
        ajmp    read_0              ;cable is ID_1
cable_22:
        cjne    a,#15h,cable_23
        ajmp    read_0              ;cable is ID_1
cable_23:
        cjne    a,#16h,cable_24
        ajmp    read_0              ;cable is ID_1
cable_24:
        cjne    a,#17h,cable_25
        ajmp    read_0              ;cable is ID_1
cable_25:
        cjne    a,#18h,cable_26
        ajmp    read_0              ;cable is ID_1
cable_26:
        cjne    a,#19h,cable_27
        ajmp    read_0              ;cable is ID_1
cable_27:
```

APPENDIX A-continued

```
         cjne    a,#1ah,cable_28
         ajmp   read_0                  ;cable is ID_1
cable_28:
         cjne    a,#1bh,cable_29
         ajmp   read_0                  ;cable is ID_1
cable_29:
         cjne    a,#1ch,cable_off
         ajmp   read_1                  ;cable is ID_2
cable_off:
         mov    a,#cable_err             ;cable is error
         ret
read_0:
         mov    a,#ID_1                 ;assigned cable as ID_1
         ret
read_1:
         mov    a,#ID_2                 ;assigned cable as ID_2
         ret
read_2:
         mov    a,#ID_3                 ;assigned cable as ID_3
         ret
read_3:
         mov    a,#ID_4                 ;assigned cable as ID_4
         ret
read_4:
         mov    a,#ID_5                 ;assigned cable as ID_5
         ret
read_5:
         mov    a,#ID_6                 ;assigned cable as ID_6
         ret
read_6:
         mov    a,#ID_7                 ;assigned cable as ID_7
         ret
read_7:
         mov    a,#ID_8                 ;assigned cable as ID_8
         ret
```

What is claimed is:

1. A method for testing an electronic ignition control module, said method comprising the steps of:
   a) manually placing the electronic ignition control module in electrical communication with an electronic ignition control module tester via a first multiple pin electrical connector;
   b) electronically identifying the electronic ignition control module type by sensing shorted and open conditions between the multiple pins of the electrical connector; and
   c) performing a plurality of tests upon the electronic ignition control module, the particular tests performed being dependent upon the identification of the particular electronic ignition control module type being tested.

2. The method as recited in claim 1 wherein the step of placing the electronic ignition control module in electrical communication with the electronic ignition control module tester comprises:
   a) placing a first electrical connector of an adaptor cable in electrical communication with the electronic ignition control module to be tested, the adaptor cable being dedicated for use with a particular electronic ignition control module type; and
   b) placing a second electrical connector of the adaptor cable in electrical communication with the electronic ignition control module tester.

3. The method as recited in claim 2 wherein the step of placing the first electrical connector of the adaptor cable in electrical communication with the electronic ignition control module to be tested comprises attaching the electronic ignition control module to a first electrical connector physically configured to attach to only one electronic ignition control module type.

4. The method as recited in claim 1 further comprising the step of indicating a pass/fail condition of the electronic ignition control module.

5. The method as recited in claim 1 wherein:
   a) the step of identifying the electronic ignition control module comprises an electronic ignition control module tester identifying the adaptor cable; and
   b) the step of the electronic ignition control module tester performing testing of the electronic ignition control module comprises the micro controller selecting a stored list of predefined test instructions, selection of the stored list being dependent upon the identification of the adaptor cable.

6. The method as recited in claim 1 wherein the step of performing a plurality of tests upon the electronic ignition control module comprises performing:
   a) a Reference/PIP test;
   b) an EST/SPOUT test;
   c) a bypass test;
   d) a low RPM test; and
   e) a high RPM test.

7. An electronic ignition control module test system, said system comprising:
   a) a plurality of adaptor cables, each adaptor cable being configured for testing a particular ignition module type and being electrically connectable thereto, each of the adaptor cables having a multiplicity of selectively shorted pins; and
   b) an electronic ignition control module tester to which said adaptor cables are electrically connectable, said electronic ignition control module tester comprising identification circuitry for identifying the particular adaptor cable electrically connected thereto, by sensing shorted and open conditions between multiple pins of the adaptor cables, the identification of the particular adaptor cable defining tests to be performed based upon the ignition module electrically connected thereto.

8. The system as recited in claim 7 wherein said electronic ignition control module tester comprises:
   a) a micro controller and
   b) a memory;
   c) wherein in said micro controller a selected list of predefined test instructions is stored in said memory, selection of the stored list being dependent upon the identification of the particular adaptor cable.

9. The system as recited in claim 8 wherein said list of predefined test instructions comprises instructions for performing:
   a) a Reference/PIP test;
   b) an EST/SPOUT test;
   c) Bypass test;
   d) a low RPM test; and
   e) a high RPM test.

* * * * *